(12) United States Patent  (10) Patent No.: US 12,453,794 B1
Bilal  (45) Date of Patent: Oct. 28, 2025

(54) HELMET MOUNT WITH ACCESSORIES

(71) Applicant: Innovative Creations, LLC, Plano, TX (US)

(72) Inventor: Haitham Bilal, Plano, TX (US)

(73) Assignee: Innovative Creations, LLC, Plano, TX (US)

( * ) Notice: Subject to any disclaimer, the term of this patent is extended or adjusted under 35 U.S.C. 154(b) by 0 days.

(21) Appl. No.: 19/222,939

(22) Filed: May 29, 2025

Related U.S. Application Data

(60) Provisional application No. 63/760,125, filed on Feb. 19, 2025, provisional application No. 63/653,231, filed on May 30, 2024.

(51) Int. Cl.
*A61L 2/10* (2006.01)
*A61L 2/24* (2006.01)
*H05K 1/02* (2006.01)

(52) U.S. Cl.
CPC ............... *A61L 2/10* (2013.01); *A61L 2/24* (2013.01); *A61L 2202/11* (2013.01); *A61L 2202/14* (2013.01); *H05K 1/0203* (2013.01); *H05K 2201/10106* (2013.01)

(58) Field of Classification Search
None
See application file for complete search history.

(56) References Cited

U.S. PATENT DOCUMENTS

| | | | |
|---|---|---|---|
| 7,959,018 B2 | 6/2011 | Flickinger | |
| 9,919,196 B2 | 3/2018 | Gellman | |
| 10,323,882 B2 | 6/2019 | Durham | |
| 10,689,793 B2 | 6/2020 | Glass et al. | |
| 11,766,493 B2 | 9/2023 | Koyama et al. | |
| 2009/0283485 A1 | 11/2009 | Anderson | |
| 2022/0096692 A1 | 3/2022 | Dutra | |

FOREIGN PATENT DOCUMENTS

| | | | | |
|---|---|---|---|---|
| CN | 200973845 Y | 11/2007 | | |
| CN | 212369325 U | 1/2021 | | |
| CN | 111050810 B | 5/2021 | | |
| CN | 114007658 A | 2/2022 | | |
| CN | 220603265 U | 3/2024 | | |
| DE | 102019133203 B4 | * 5/2022 | ......... | H10H 20/8586 |
| DE | 202022102262 U1 | 5/2022 | | |
| ES | 1077521 U | 8/2012 | | |
| ES | 1298471 U | 3/2023 | | |
| KR | 20110038191 A | * 4/2011 | | |
| KR | 20110086403 A | * 7/2011 | ................ | F24F 8/22 |
| KR | 101898429 B1 | 10/2018 | | |
| KR | 102220054 B1 | * 2/2021 | ............... | A61L 2/26 |
| KR | 20210056534 A | 5/2021 | | |
| KR | 20220047183 A | * 4/2022 | ................ | F26B 3/30 |
| KR | 102428900 B1 | 8/2022 | | |
| KR | 102682438 B1 | 7/2024 | | |
| TW | M602003 U | 10/2020 | | |
| TW | M608906 U | 3/2021 | | |
| TW | I858664 B | 10/2024 | | |

* cited by examiner

*Primary Examiner* — Andrew Smyth

(57) ABSTRACT

A helmet mount including a curved arm with a first end with a sanitizer assembly disposed at the first end, the sanitizer assembly including a fan and an ultraviolet (UV) light source, a timer in communication with the fan and the UV light source, at least one heat sink disposed within the sanitizer assembly, and in thermal communication with a printed circuit board (PCB) that is used to control the UV light source, where the timer is configured to control operation of the fan and the UV light source.

20 Claims, 5 Drawing Sheets

HELMET MOUNT WITH ACCESSORIES

CROSS REFERENCE TO RELATED APPLICATIONS

This application claims the benefit of U.S. Provisional Application No. 63/760,125, filed on Feb. 19, 2025 and U.S. Provisional Application No. 63/653,231, filed on May 30, 2024, the contents of which are incorporated by reference as if fully set forth herein.

BACKGROUND

Traditional helmet mounts which are used to hold helmets for motorcyclists or others who utilize a helmet have traditionally intended to serve a singular purpose-holding a helmet. However, as helmets have increased in complexity, additional needs have arisen to accommodate modern helmets and helmet users.

For example, with the rise of wireless communication devices being placed within helmet, as well as the presence of cameras, lights, and other features, there is a need to provide power to charge those devices.

Further, as different forms of padding have been included in helmets, the accumulation of sweat and bacteria presents hygienic concerns for users.

The cumulative effect of these various needs is that a larger and larger stack of items may be needed for the composition of the helmet mount. What is needed is a helmet mount which provides a compact solution that to handle hygienic, power, and storage needs combined.

SUMMARY

Disclosed herein is a helmet mount with multiple options that provides enhanced features for modern helmets. Features may include an air circulation fan and sanitizing UV light, each controlled by a push button switch and configured with a timer to assist with control. The air circulation fan may be placed to provide drying of sweat or other moisture that has accumulated within the helmet. Other features may include one or more charging ports (such as USB charging ports) to charge a helmet, helmet accessories, or other peripherals, including communication devices, cameras, lights, or other devices which require charging. The helmet mount may be arranged with grooves and hooks that permits hanging of common accessories such as clothes, jackets, backpacks, gloves, and keys.

In some aspects, the techniques described herein relate to a device for securing a helmet, the device including, a curved arm with a first end and a second end, a sanitizer assembly disposed at the first end, the sanitizer assembly further including a fan and an ultraviolet (UV) light source, a wall mount disposed at the second end, a timer in communication with the fan and the UV light source, at least one heat sink disposed within the sanitizer assembly and in thermal communication with a printed circuit board (PCB) that is used to control the UV light source, a set of charging ports, where the timer is configured to control operation of the fan and the UV light source.

In certain embodiments, the sanitizer assembly is sized to hold a motorcycle helmet. In certain embodiments, the UV light source includes a first plurality of UV LEDs disposed around the PCB. In some embodiments, the PCB is an aluminum PCB.

In some embodiments, the UV light source further includes a second plurality of UV LEDs disposed around a second PCB. The first plurality of UV LEDs may be arranged to emit light in a first direction and wherein the second plurality of LEDs may be arranged to emit light in a second direction that is opposite the first direction.

In some embodiments, the device further includes at least one thermal insulation layer disposed between the fan and the at least one heat sink. In some embodiments the set of charging ports are disposed on the sanitizer assembly and are powered without regard to the control operation provided by the timer.

In some embodiments, the curved arm may include at least one depression disposed on a horizontal portion of the curved arm.

In some embodiments, the device may include an activation circuit which is configured to engage the timer and activate at least one of the fans and the UV light source for a predetermined time.

In some aspects, the techniques described herein relate to a device for securing a helmet, the device including: a curved arm, a sanitizer assembly disposed at a first end of the curved arm, the sanitizer assembly being sized to hold a motorcycle helmet and including a fan and an ultraviolet (UV) light source, a timer in communication with the fan and the UV light source, wherein the timer is configured to control operation of the fan and the UV light source.

In some embodiments, the device may include at least one heat sink disposed within the sanitizer assembly and adjacent to a PCB that is used to control the UV light source. The UV light source may include a first plurality of UV LEDs disposed around the PCB. The UV light source may further include a second plurality of UV LEDs disposed around a second PCB. In certain embodiments the first plurality of UV LEDs are arranged to emit light in a first direction and wherein the second plurality of LEDs are arranged to emit light in a second direction that is opposite the first direction. In some embodiments at least one charging ports is disposed on the sanitizer assembly and are powered without regard to the control operation provided by the timer. In some embodiments, the curved arm may include at least one depression disposed on a horizontal portion of the curved arm. In some embodiments, the device may include an activation circuit which is configured to engage the timer and activate at least one of the fan and the UV light source for a predetermined time.

In some aspects, the techniques described herein relate to a device for securing a helmet, the device including: a sanitizer assembly disposed at an end of an arm, the sanitizer assembly further including a fan and an ultraviolet (UV) light source, a timer in communication with the fan and the UV light source, at least one heat sink disposed within the sanitizer assembly and adjacent to an aluminum PCB that is used to control the UV light source, wherein the timer is configured to control operation of the fan and the UV light source and the device may include an activation circuit which is configured to engage the timer and activate at least one of the fan and the UV light source for a predetermined time

BRIEF DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

DETAILED DESCRIPTION

Figure 1:
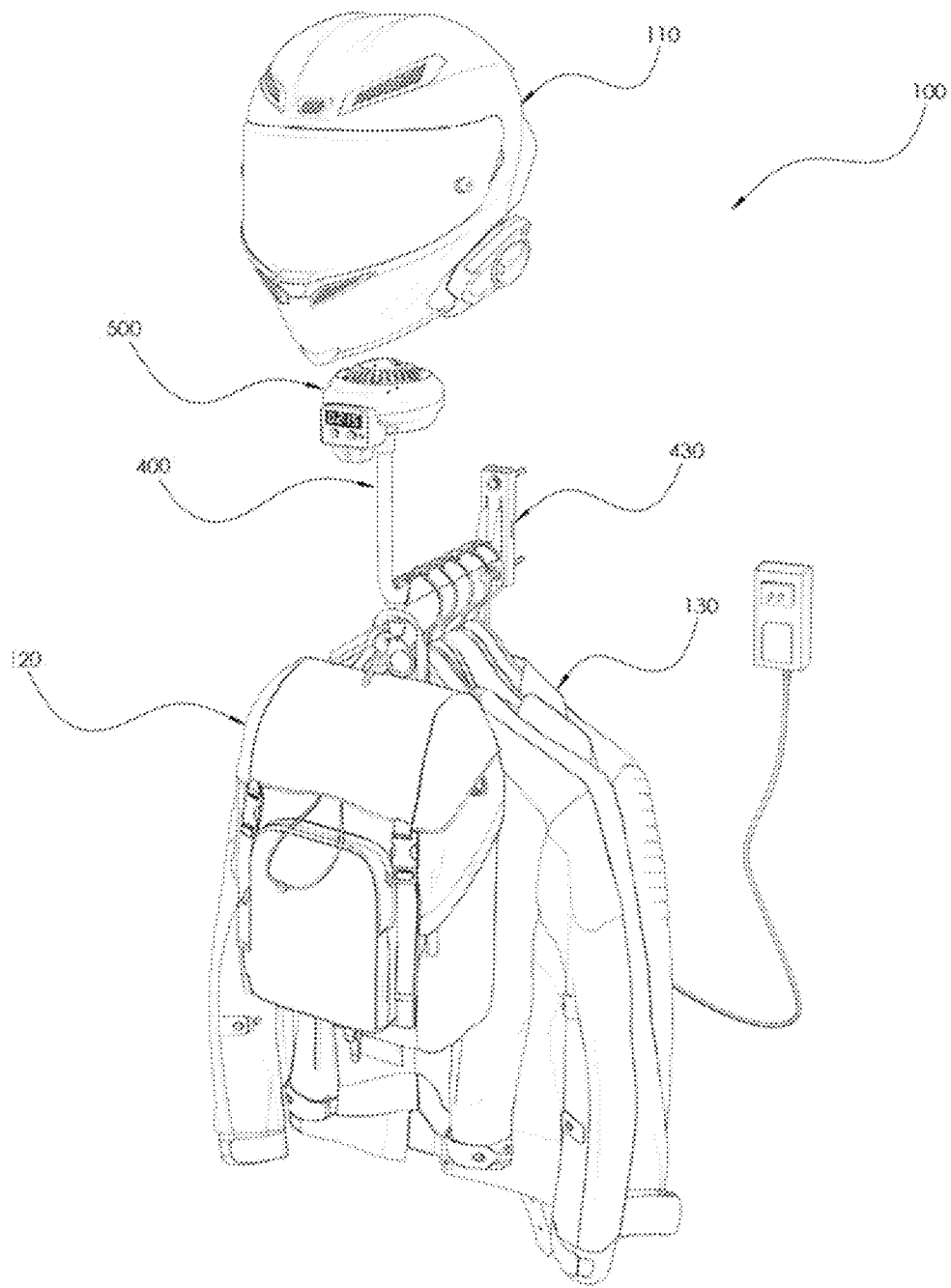
FIG. 1 provides a view of one embodiment of a helmet mount in use with various accessories.

FIG. 1 illustrates a helmet mount 100 installed and in use. As depicted, lower carrier assembly 400 is engaged with wall bracket 430, thus providing an exemplary use case for helmet mount 100. As depicted, lower carrier assembly 400 is a curved arm although other geometries may be utilized. Helmet 110 is shown above upper mount assembly 500 and, during use, helmet 110 may be place atop upper mount assembly 500, resting so that, in operation, a fan and UV lights, disposed within upper mount assembly 500 will serve work to dry and sanitize a helmet.

Lower carrier assembly 400 also includes a hook for hanging accessories such as backpack 120 and includes grooves for hanging clothing items 130. Various subcomponents of helmet mount 100 are described in further detail below.

Figure 2:
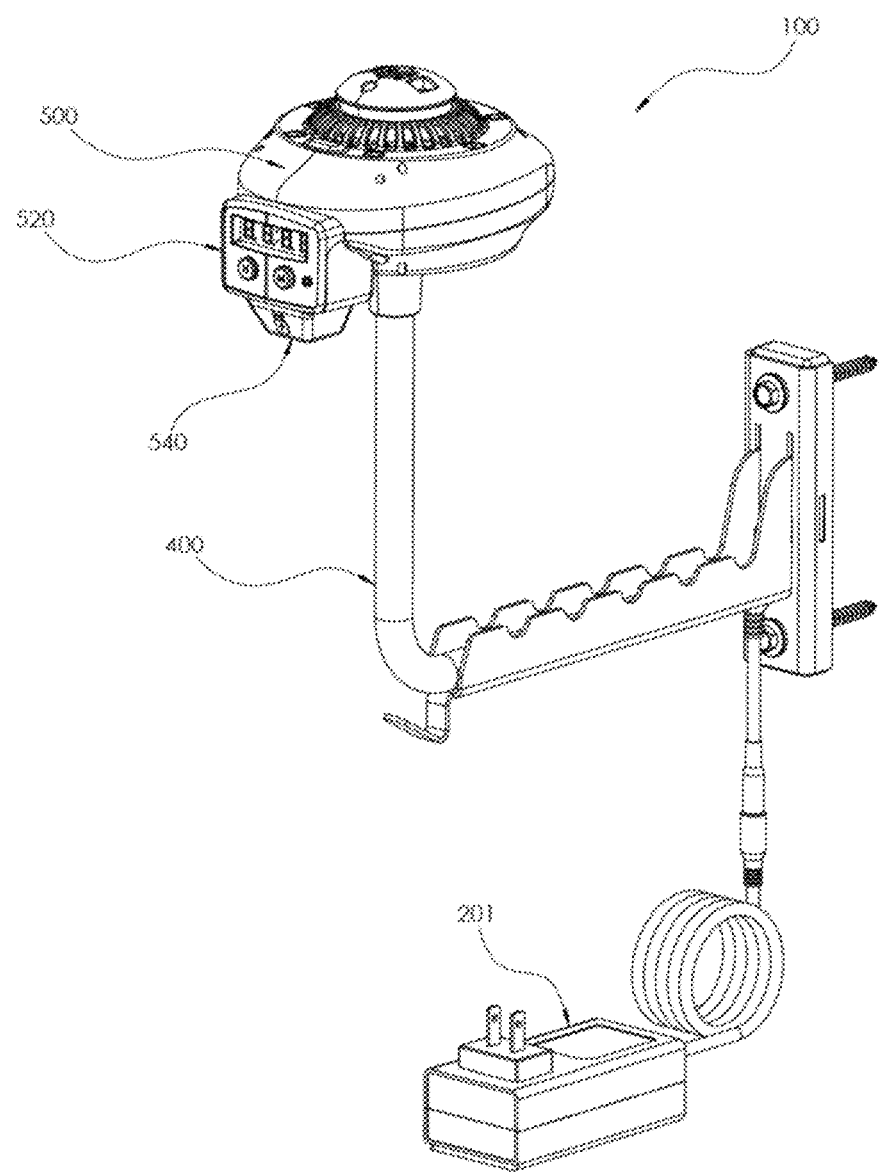
FIG. 2 provides a perspective view of one embodiment of a helmet mount consistent with this disclosure.

FIG. 2 depicts various aspects of helmet mount 100. As shown in FIG. 2, upper mount assembly 500 is disposed above lower carrier assembly 400. Front plastic shell 520 is disposed at the front of upper mount assembly 500 and various electronics that control features of upper mount assembly 500. As depicted, front plastic shell 520 includes a timer display and timer control buttons which may be used in connection with a timer to control a fan and UV lights which are included within upper mount assembly 500. Ports 540 are disposed at the bottom of front plastic shell 520 and allow for a convenient place to plug in accessories that may be included or used in connection with a rider's helmet. Electronics inside upper mount assembly 500 and the features of front plastic shell 520 and ports 540 which require power may be powered by wall plug 201 which is configured to fit in a standard wall outlet.

Figure 3:
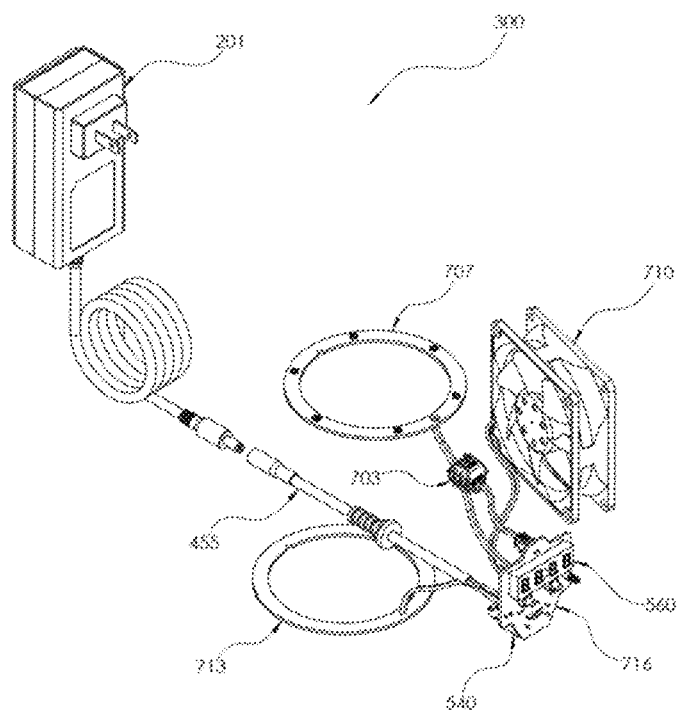
FIG. 3 provides a view of electronic components of an exemplary helmet mount consistent with this disclosure.

FIG. 3 depicts various electric components of helmet mount 100. Wall plug 201 is configured to fit a standard wall outlet, although in alternative configurations other plugs may be utilized to provide appropriate compatibility with available power. Wall plug 201 is connected to wire 455 which supplies power to main PCB 716. Main PCB 716 is designed to provide power or connection to to all powered components of helmet mount 100. As depicted in FIG. 3, this includes ports 540, timer display 560, push button electric activation button 703, upper UV light 707, electric drying fan 710, and lower UV light 713. Main PCB 716 may include a microprocessor or microcontroller to include software and/or firmware which operates the electric components (including operation of the timer elements).

Electric drying fan 710 is included within upper mount assembly 500 to encourage airflow within a helmet placed on top of upper mount assembly 500 and thus serve to aid in drying of sweat or other moisture which has accumulated in a helmet. Upper UV light 707 and lower UV light 713 provide UV light to the interior of a helmet to kill bacteria and prevent buildup of mold.

Figure 4:
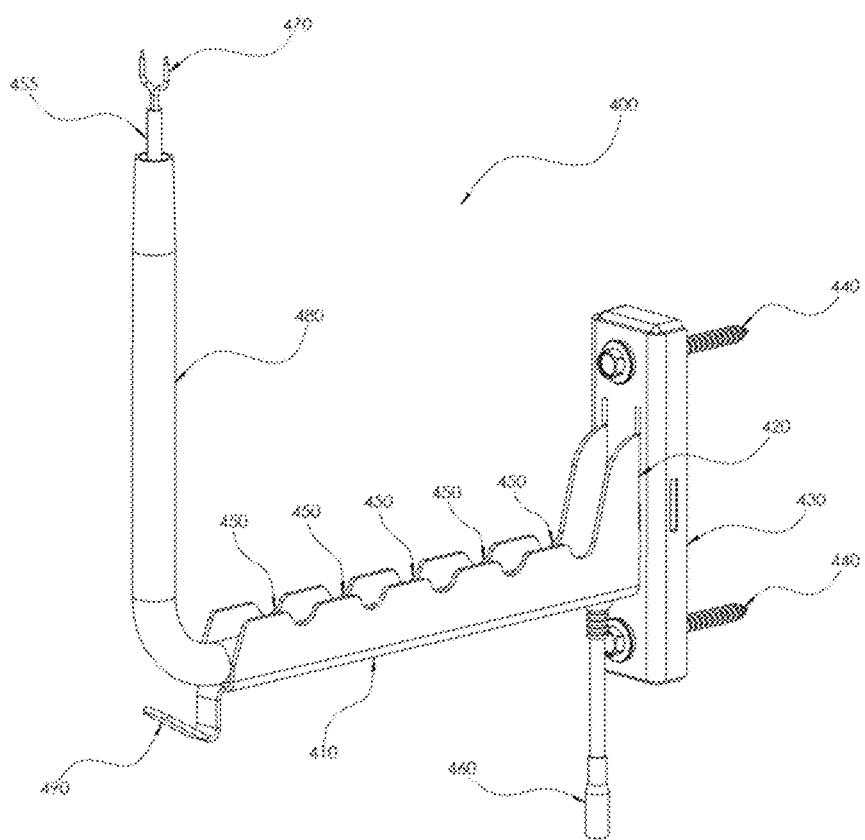
FIG. 4 provides a view of one aspect of an embodiment of a helmet mount consistent with this disclosure.

FIG. 4 depicts lower carrier assembly 400. Lower carrier assembly 400 includes carrier metal linkage 410, which has bracket hooks 420 at one end and accessory hook 490 at another end. Bracket hooks 420 are sized to removably connect to wall bracket 430, which may be secured to a wall using wall mount screws 440. Secured inside carrier metal linkage 410 and extending upwardly therefrom is carrier linkage metal pipe 480. Carrier linkage metal pipe 480 as depicted provides sufficient length so that, when upper mount assembly 500 is placed atop carrier linkage metal pipe 480 and a helmet is placed atop upper mount assembly 500 there is sufficient room for the helmet to rest on upper mount assembly 500 without obstruction by carrier metal linkage 410. Carrier linkage metal pipe 480 may be removably attached to carrier metal linkage 410 using fasteners or other means or may be permanently fixed through welding or other means. As depicted, carrier metal linkage 410 contains several grooves 450 which are disposed along carrier metal linkage 410 to allow for a user to utilize hangers in order to hang several articles of clothing from carrier metal linkage 410.

Inside carrier linkage metal pipe 480 is wire 455. Pigtail connection 470 is disposed at the top of carrier linkage metal pipe 480 and allows for the connection to a port on the bottom of upper mount assembly 500. Female pigtail connection 460 is disposed on the opposite end of wire 455 and is configured to connect to a power supply to power helmet mount 100.

Each of carrier metal linkage 410, wall bracket 430, and carrier linkage metal pipe 480 may be composed of a rigid material such as metal, so that it may be of sufficient strength to hold a typical motorcycle helmet as well as the weight of several riding jackets.

Figure 5:
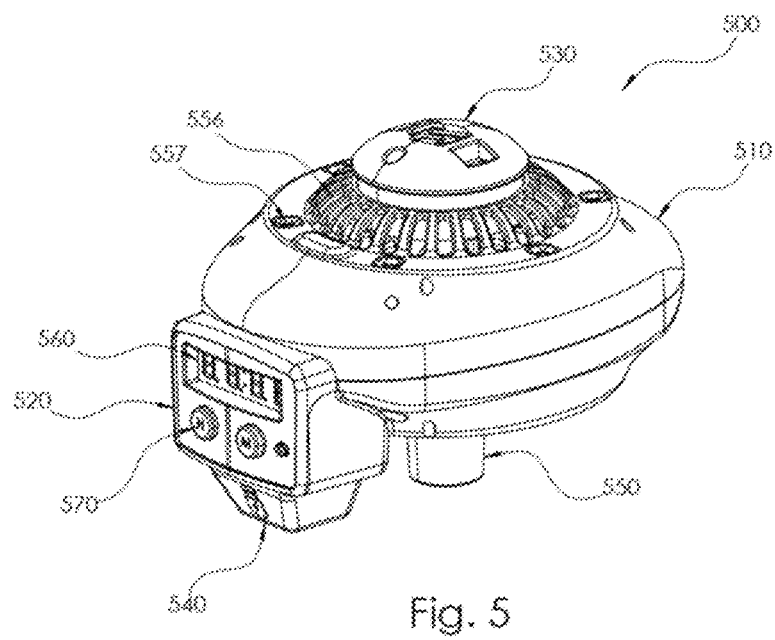
FIG. 5 provides a view of an upper mount assembly consistent with this disclosure.

FIG. 5 illustrates upper mount assembly 500. Upper mount assembly 500 is sized and shaped to hold a conventional motorcycle helmet and includes various internal components which enhance the drying, sterilizing, and/or sanitizing functions of helmet mount 100. As depicted, upper mount assembly 500 (also referred to as a sanitizer assembly) generally includes plastic shell 510 and front plastic shell 520. Disposed at the top of plastic shell 510 is activation button 530, which is spring-loaded and may be depressed by a user placing a helmet atop activation button 530 or may be depressed by a user manually. Engaging activation button will inform electronics on the main PCB about the state of the activation button and may cause actions such as turning on various components or activation of the timer, for example by way of an activation circuit. Plastic shell 510 includes vent holes 556 to allow airflow from a fan (not shown here) disposed within upper mount assembly 500. Similar vent holes are included at the bottom of plastic shell 510. Light apertures 557 are disposed atop and on the bottom of plastic shell 510 to enable ultraviolet (UV) light from enclosed within plastic shell 510 to reach interior surfaces of a helmet when the helmet is place on upper mount assembly 500. Upper mount collar 550 is disposed at the bottom of upper mount assembly 500 and enables a secure fit to other aspects of helmet mount 100.

Front plastic shell 520 includes timer display 560 and timer configuration buttons 570. The bottom of front plastic shell 520 includes charging ports 540, which may be common charging receptacles such as USB-A, USB-C or other type of charging receptacle. Ports 540 may operate to provide power without respect to the operation of the timer and without consideration of activation button 530.

Timer configuration buttons 570 may be used to adjust timer timing. In one example, a timer button may be used to set a desired time to dry and sanitize a helmet placed on helmet mount 100. By pressing both an hour and minute button, for example, the time may be reset to zero. A combination of available buttons may allow for a user to toggle on or off the UV lights included with upper mount assembly 500. For example, pressing both the hour and minute button and holding for five seconds, the UV lights will be deactivated. To activate the UV light again, the hour and minute buttons can be held for a predetermined amount of time, e.g., 5 seconds.

Figure 6:
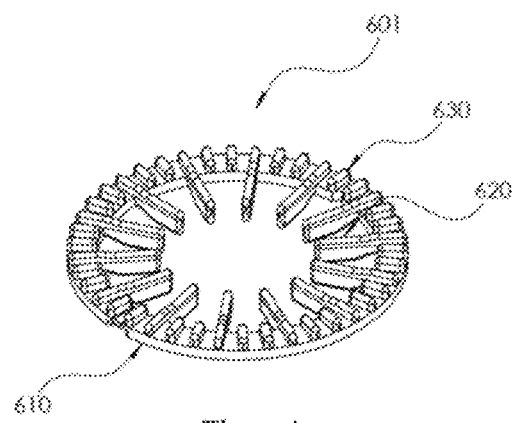
FIG. 6 provides a view of a heat sink consistent with this disclosure.

FIG. 6 illustrates an exemplary disc-shaped heat sink 601 to be used in certain embodiments of helmet mount 100. As depicted, exemplary disc-shaped heat sink 601 includes disc 610. Disposed around disc 610 are heat long sink fins 620 and short heat sink fins 630. In some embodiments, heat long sink fins 620 may be omitted. In certain embodiments, short heat sink fins 630 may be omitted. Exemplary disc-shaped heat sink 601 may be made of aluminum in order to provide enhanced heat dissipation over its surface area. In some embodiments, exemplary disc-shaped heat sink 601 may be excluded from upper mount assembly 500.

Figure 7:
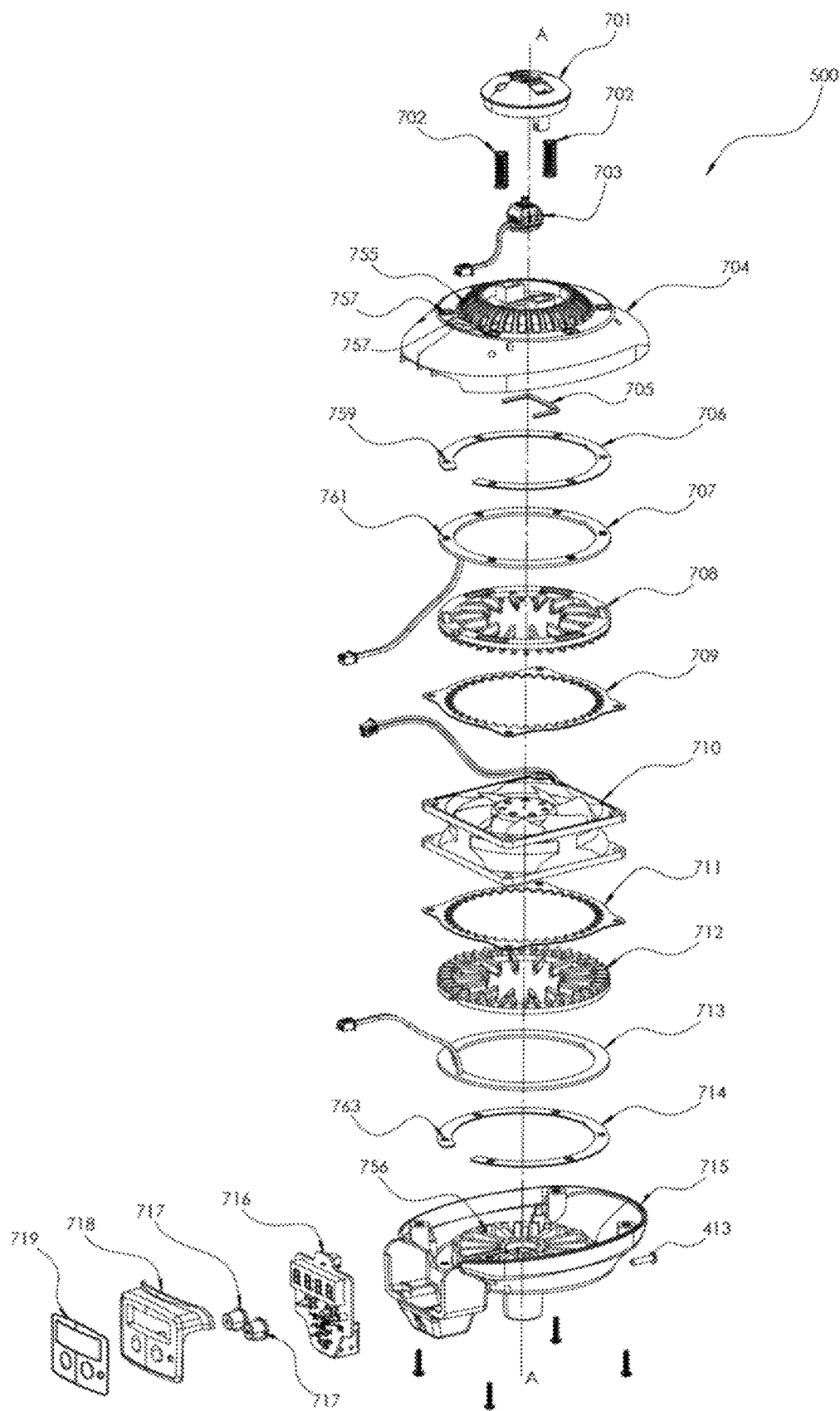
FIG. 7 provides an exploded view of an upper mount assembly consistent with this disclosure.

FIG. 7 illustrates an exploded view of upper mount assembly 500. As depicted, upper mount assembly 500 includes top plastic activation button 701, which is disposed above springs 702 and above push button electric activation button 703. Upper plastic shell 704 contains vent holes 755 which permit airflow through upper mount assembly 500. Metal wire stabilizer clip 705 provides additional stabilization to components within upper mount assembly 500. In operation metal wire stabilizer clip 705 may function to distribute otherwise uneven force applied to top plastic activation button 701. Further, metal wire stabilizer clip 705 connects to the underside of upper plastic shell 704 and may secure top plastic activation button 701 in place.

Additionally disposed within upper mount assembly 500 are upper thermal insulation layer 706, upper UV light 707, upper heat sink 708, upper secondary thermal insulation layer 709, electric drying fan 710, lower secondary thermal insulation layer 711, lower heat sink 712, lower UV light 713, lower thermal insulation layer 714, and lower plastic shell 715. Lower plastic shell 715, similar to upper plastic shell 704 is depicted with vent holes 756 to encourage airflow during operation of electric drying fan 710 as well as upper UV light 707 and lower UV light 713. In one embodiment, lower UV light 713 and upper UV light 707 are made of UV LEDs (761) which are disposed around a disc made of aluminum printed circuit board (PCB). By utilizing aluminum PCB, heat generated by UV LEDs disposed around the UV light disc may be efficiently dispersed around the disc, and subsequently may be easily transferred to lower heat sink 712 and upper heat sink 708. To further enhance heat transfer, a thermal paste may be used to affix the UV lights to the aluminum heat sink. Use of heat sinks, thermal paste, and aluminum PCB, as well as electric drying fan 710 allow for UV LEDs to be operated at a higher voltage to encourage enhanced effectiveness of the UV lights. Additionally, placement of electric drying fan 710 within upper mount assembly 500 and inline with upper UV light 707 and lower UV light 713 (and heat sinks 708 and 712) allows for the airflow caused by the fan's rotation to be heated and provide enhanced drying effects for moisture trapped within a helmet placed on top of upper mount assembly 500. As depicted in FIG. 7, upper UV light 707 is aimed in an upward direction and lower UV light 713 is aimed in a downward direction. Providing light in different directions encourages wide coverage of UV energy to be used for sanitizing/sterilizing purposes.

As depicted, top plastic activation button 701, in connection with springs 702 and push button electric activation button 703 allow for activation of circuitry of the device. In one mode of operation, a helmet may be placed on top of top plastic activation button 701 such that it causes the device electronics to activate and for sanitizing and drying to commence. However, in alternative embodiments, sensors may be used in place of the switch mechanism. For example, photoelectric, ultrasonic, or other proximity sensors may be utilized so that when a helmet is placed atop the sensor at the top of upper mount assembly 500, the device electronics will activate and sanitization and drying may commence.

Upper plastic shell 704, in additional to vent holes 755 also contains multiple light apertures 757. Similarly, upper thermal insulation layer 706 contains insultation light apertures 759. In this manner, UV light from individual LEDs 761 disposed around upper UV light 707 may be emitted from individual LEDs 761 and travel through upper thermal insulation layer 706 and upper plastic shell 704 to provide sanitizing UV light to a helmet disposed on upper mount assembly 500. Lower thermal insulation layer 714 similarly includes insulation light apertures 763 to permit UV light to be transmitted from lower UV light 713 and through lower thermal insulation layer 714. Additional apertures are disposed on lower plastic shell 715 to permit transmission of UV light through lower plastic shell 715.

As depicted, to be attached to the front of upper mount assembly 500 is main PCB 716. Buttons 717 are placed in front of the switches of main PCB 716 and front plastic shell 718 is disposed in front of buttons 717. Buttons 717 may be utilized to control a timer and microprocessor which are included on main PCB 716. Clear plastic screen 719 is adhered to front plastic shell 718 using conventional methods.

The foregoing detailed description has been given for clearness of understanding only, and no unnecessary limitation should be understood therefrom. While the present invention has been described with reference to preferred embodiments and several alternative embodiments, which embodiments have been set forth in considerable detail for the purposes of making a complete disclosure of the invention, such embodiments are merely exemplary and are not intended to be limiting or represent an exhaustive enumeration of all aspects of the invention. The scope of the invention therefore shall be defined solely by the claims. Further, it will be apparent to those of skill in the art that numerous changes may be made in such details without departing from the spirit and the principles of the invention. It should be appreciated that the present invention is capable of being embodied in other forms without departing from its essential characteristics.

What is claimed is:

1. A device for securing a helmet, the device comprising:
a curved arm with a first end and a second end;
a sanitizer assembly disposed at the first end, the sanitizer assembly further comprising a fan and an ultraviolet (UV) light source;
a wall mount disposed at the second end;
a timer in communication with the fan and the UV light source;

at least one heat sink disposed within the sanitizer assembly, and in thermal communication with a printed circuit board (PCB) that is used to control the UV light source; and a set of charging ports;

wherein the timer is configured to control operation of the fan and the UV light source; and wherein the set of charging ports are disposed on the sanitizer assembly.

2. The device of claim 1, wherein the sanitizer assembly is sized to hold a motorcycle helmet.

3. The device of claim 1, wherein the UV light source comprises a first plurality of UV LEDs disposed around the PCB.

4. The device of claim 3, wherein the PCB is an aluminum PCB.

5. The device of claim 3, wherein the UV light source further comprises a second plurality of UV LEDs disposed around a second PCB.

6. The device of claim 5, wherein the first plurality of UV LEDs are arranged to emit light in a first direction and wherein the second plurality of LEDs are arranged to emit light in a second direction that is opposite the first direction.

7. The device of claim 5, the device further comprising at least one thermal insulation layer disposed between the fan and the at least one heat sink.

8. The device of claim 7, wherein the set of charging ports are powered without regard to the control operation provided by the timer.

9. The device of claim 2 further comprising at least one depression disposed on a horizontal portion of the curved arm.

10. The device of claim 7, the device further comprising an activation circuit which is configured to engage the timer and activate at least one of the fans and the UV light source for a predetermined time.

11. A device for securing a helmet, the device comprising:

a curved arm;

a sanitizer assembly disposed at a first end of the curved arm, the sanitizer assembly being sized to hold a motorcycle helmet and comprising a fan and an ultraviolet (UV) light source; and a timer in communication with the fan and the UV light source;

wherein the timer is configured to control operation of the fan and the UV light source; and wherein at least one charging port is disposed on the sanitizer assembly.

12. The device of claim 11 further comprising at least one heat sink disposed within the sanitizer assembly and adjacent to a PCB that is used to control the UV light source.

13. The device of claim 12, wherein the UV light source comprises a first plurality of UV LEDs disposed around the PCB.

14. The device of claim 13, wherein the UV light source further comprises a second plurality of UV LEDs disposed around a second PCB.

15. The device of claim 14, wherein the first plurality of UV LEDs are arranged to emit light in a first direction and wherein the second plurality of LEDs are arranged to emit light in a second direction that is opposite the first direction.

16. The device of claim 15, wherein at least one charging port is powered without regard to the control operation provided by the timer.

17. The device of claim 16 further comprising at least one depression disposed on a horizontal portion of the curved arm.

18. The device of claim 16, the device further comprising an activation circuit which is configured to engage the timer and activate at least one of the fan and the UV light source for a predetermined time.

19. A device for securing a helmet, the device comprising:

a sanitizer assembly disposed at an end of an arm, the sanitizer assembly further comprising a fan and an ultraviolet (UV) light source;

a timer in communication with the fan and the UV light source; and at least one heat sink disposed within the sanitizer assembly and adjacent to an aluminum PCB that is used to control the UV light source;

wherein the timer is configured to control operation of the fan and the UV light source; and wherein at least one charging port is disposed on the sanitizer assembly.

20. The device of claim 19, the device further comprising an activation circuit which is configured to engage the timer and activate at least one of the fan and the UV light source for a predetermined time.

* * * * *